United States Patent
Abdelli (10) Patent No.: US 7,113,756 B2
(45) Date of Patent: Sep. 26, 2006

(54) PASSIVE MIXER WITH IMPROVED LINEARITY

(75) Inventor: Said E. Abdelli, Minneapolis, MN (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 11/144,343

(22) Filed: Jun. 3, 2005

(65) Prior Publication Data

US 2005/0221775 A1    Oct. 6, 2005

Related U.S. Application Data

(63) Continuation-in-part of application No. 10/644,630, filed on Aug. 19, 2003.

(51) Int. Cl.
*H01Q 11/12* (2006.01)
*H04B 1/04* (2006.01)
*H04B 1/28* (2006.01)

(52) U.S. Cl. ............... 455/118; 455/326; 455/333
(58) Field of Classification Search ........ 455/313–315, 455/318–319, 323–326, 333, 118; 327/113
See application file for complete search history.

(56) References Cited

U.S. PATENT DOCUMENTS 6,847,808 B1 * 1/2005 Zhou .................... 455/189.1
6,972,610 B1 * 12/2005 Behzad ................. 327/359
2004/0043741 A1 * 3/2004 Goddard et al. ......... 455/313
2005/0043003 A1 * 2/2005 Abdelli .................. 455/326

OTHER PUBLICATIONS

Peter R. Kinget et al. "*A 1-GHz CMOS UP-Conversion Mixer*", IEEE Journal of Solid-State Circuits, vol. 32, No. 3, pp. 370-376 (Mar. 1997).
Behzad Razavi, "*RF Microelectronics*", ©Prentic Hall, pp. 14-25 (1998).

* cited by examiner

*Primary Examiner*—Nguyen T. Vo
(74) *Attorney, Agent, or Firm*—McDonnell Boehnen Hulbert & Berghoff LLP

(57) ABSTRACT

A mixer circuit is disclosed that includes a first mixer stage including first and second transmission gates. The mixer circuit also includes a second mixer stage including third and fourth transmission gates. The mixer further includes a first base band signal terminal coupled with the first and second transmission gates and a second base band signal terminal coupled with the third and fourth transmission gates. The mixer circuit processes signals so as to mix a base band signal communicated to the first and second base band signal terminals with a differential LO signal communicated to first and second LO signal terminals to create a first mixed differential signal. Alternatively, the mixer extracts a base band signal from a mixed signal communicated to the first and second mixed signal terminals signal using the LO signal communicated to the first and second LO signal terminals.

19 Claims, 5 Drawing Sheets

PASSIVE MIXER WITH IMPROVED LINEARITY

CROSS REFERENCE TO RELATED APPLICATIONS

This application claims priority under 35 U.S.C. § 120 as a continuation-in-part to U.S. patent application Ser. No. 10/644,630, filed on Aug. 19, 2003, which is currently pending. The disclosure of U.S. patent application Ser. No. 10/644,630 is herein incorporated by reference in its entirety.

BACKGROUND

1. Field

This disclosure relates to mixer circuits.

2. Description of Related Art

Mixer circuits are commonly used in a number of applications. As one example, they are often used in radio frequency (RF) applications for up-converting (up-mixing) or down-converting (down-mixing). In this context, up-converting is the process of mixing a base band signal, such as a differential base band signal, with an RF signal, such as a differential RF signal that is generated by a local oscillator circuit that operates in the RF range. This process generates a mixed RF signal with the base band information included with (mixed with) the RF signal generated by the local oscillator. Down-converting is the process of separating (un-mixing) the base band signal from the mixed RF signal. This is typically accomplished by using a mixer circuit with a local oscillator of substantially an identical frequency as was used to mix the mixed RF signal.

One typical type of mixer circuit is a passive mixer circuit, which may be implemented using a complementary-metal-oxide semiconductor circuit fabrication process (e.g. an integrated circuit). In such circuits, the operation of such mixer circuits is dependent on the linear range of those circuits. In this respect, the linear range of the circuit affects the one decibel (1 dB) compression point and the third intercept point (IP3), which are measures of the adverse affects of non-linearities on the gain and performance of such circuits. In this respect, current approaches for implementing passive mixer circuits have certain limitations. These limitations include included limited linear ranges, which result in 1 db compression points and IP3 points that are unacceptable for RF signals with higher amplitudes (e.g. these circuits have insufficient gain when processing such signals). Therefore, alternative approaches for implementing such circuits are desirable.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are given by way of example and meant to be illustrative, not limiting in scope. In various embodiments, one or more of the above-described problems have been reduced or eliminated, while other embodiments are directed to other improvements.

A mixer circuit is disclosed that includes a first mixer stage comprising a first transmission gate and a second transmission gate. The first transmission gate is coupled with a first MIXED signal terminal and first and second local oscillator (LO) signal terminals. The second transmission gate is coupled with a second MIXED signal terminal and the first and second LO signal terminals. The mixer further includes a second mixer stage comprising a third transmission gate and a fourth transmission gate. The third transmission gate is coupled with the first MIXED signal terminal and the first and second local oscillator signal terminals so as to operate out of phase with the first transmission gate. The fourth transmission gate is coupled with the second MIXED signal terminal and the first and second local oscillator signal terminals so as to operate out of phase with the second transmission gate.

The mixer still further includes a first base band signal terminal coupled with the first and second transmission gates and a second base band signal terminal coupled with the third and fourth transmission gates. The mixer circuit processes signals so as to mix a base band signal communicated to the first and second base band signal terminals with a differential LO signal communicated to the first and second LO signal terminals to create a first mixed differential signal. Alternatively, the mixer extracts a base band signal from a mixed signal communicated to the first and second mixed signal terminals signal using a LO signal communicated to the first and second LO signal terminals. In addition to the aspects and embodiments described above, further aspects and embodiments will become apparent by reference to the drawings and by study of the following detailed description.

BRIEF DESCRIPTION OF THE DRAWINGS

Exemplary embodiments are illustrated in referenced figures of the drawings. It is intended that the embodiments and figures disclosed herein are to be considered illustrative rather than restrictive.

DETAILED DESCRIPTION

For purposes of this disclosure, the embodiments discussed herein are described in the context of radio frequency (RF) circuits. However, it will be appreciated that using such mixer circuits for RF applications is only one of any number of applications that are possible. For example, such circuits may be used as part of an analog to digital converter or as part of a limiter circuit, as two possibilities.

Differential Mixer Circuit Overview

Figure 1:
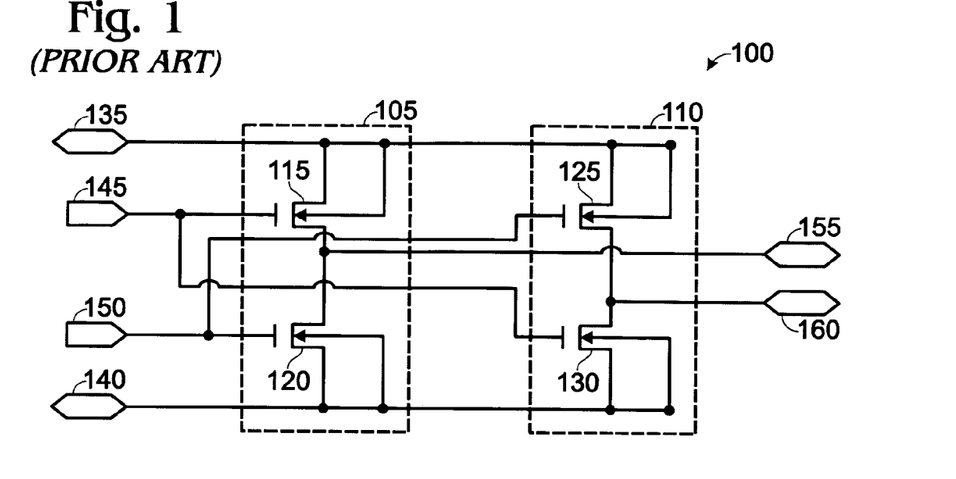
FIG. 1 is a schematic diagram illustrating a prior art embodiment of a differential mixer circuit.

Referring now to FIG. 1, a schematic diagram of a prior art complementary-metal-oxide semiconductor (CMOS) passive mixer circuit 100 is shown. The mixer 100 comprises a first stage 105 and a second stage 110. Each stage comprises two n-type field effect transistors (FETs). In this regard, the first mixer stage 105 comprises FETs 115 and 120. The second stage 110 comprises FETs 125 and 130. The mixer 100 also comprises radio frequency (RF) mixed signal terminals 135 and 140 and local oscillator (LO) signal terminals 145 and 150. The RF mixed signal terminals 135 and 140 are used to communicate RF mixed signals to and/or from the mixer 100, such as for use in a radio receiver, transmitter and/or transceiver. The LO signal terminals 145 and 150 are used to supply a LO signal to the mixer 100 for use in up-converting and/or down-converting signals processed by the mixer 100. The mixer 100 further comprises base band signal terminals 155 and 160, which are used to communicate base band signals (e.g. voice) to and/or from the mixer 100. As was noted above, while this disclosure is generally directed to RF applications, it will be appreciated that other applications for such mixer circuits exist.

The RF, LO and base band signals that are typically employed with mixer 100 are differential signals, with opposite phases of such signals being communicated on each of the respective differential signal terminal pairs. (RF 135/140; LO 145/150; and base band 155/160). A mixed RF signal is generated by the mixer 100 by communicating a differential base band signal to the mixer 100 via the base band signal terminals 155 and 160 and communicating a differential LO signal to the mixer 100 via the LO signal terminal 145 and 150. The differential LO signal, for RF applications, is a signal having a frequency in the RF range. The differential base band signal is typically a signal in the kilohertz range, such as a signal corresponding to a human voice.

The LO signal and the base band signal are then mixed (e.g. up-converted) by generating a mixed RF differential signal that may be communicated external to the mixer 100 via the RF signal terminals 135 and 140. The mixed RF signal may then be communicated to, for example, an antenna for airborne transmission, such as from one handheld two-way radio to another. The mixed signal is generated as the result of the base band signal being conducted by the FETs 115–103 of the first and second mixer stages 105 and 110 in dependence on the LO signals applied to the gates of those FETs.

The mixer 100 may also extract a base band signal from a previously mixed RF signal, as has been previously indicated. In this situation, the mixer 100 receives the mixed RF signal via the RF signal terminals 135 and 140. An LO signal is communicated to the mixer 100 via the LO signal terminals 145 and 150. The first and second mixer stages (105 and 110) then process the received mixed RF signal with the LO signal to extract a base band signal. The base band signal is then communicated out of the mixer 100 via the base band signal terminals 155 and 160. The base band signal may then, in certain embodiments, be communicated to an audio processing circuit (not shown) for playback, such as in a handheld two-way radio or a radio receiver.

However, as was previously indicated, the mixer 100 has certain limitations. For example, the signals processed by the mixer 100 become larger in amplitude (e.g. the base band signal and/or the RF signal) the gate to source voltage ($V_{gs}$) of the FETs 115–130 is reduced, causing the channel resistance of the FETs 115–130 to increase. The FETs 115–130, in this situation, are operating outside their linear region. Such a situation is undesirable because the mixer 100 becomes more susceptible to noise, which may be introduced into the mixed RF signal and/or base band signal due to the transistor resistance being increased due to the reduction in $V_{gs}$.

In this situation, the 1 db compression point and/or the IP3 point of such a mixer circuit may be lower than is desirable for processing certain signals. Additionally, such an increase in the conduction resistance of the FETs 115–130 may result in the introduction of harmonic noise by mixer 100 to the RF (e.g. mixed signals) and/or base band signals being processed by the mixer 100. Therefore, based on the foregoing, other approaches for implementing a passive mixer circuit are desirable.

Transmission Gate Mixer Circuits

Figure 2:
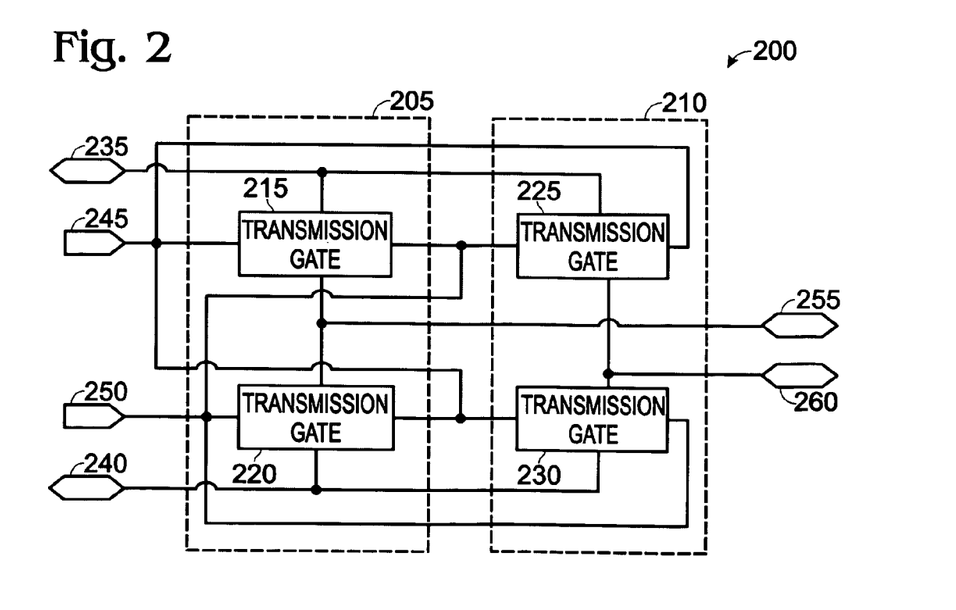
FIG. 2 is a schematic/block diagram illustrating an improved mixer circuit.

Referring now to FIG. 2, a schematic/block diagram of a transmission-gate (t-gate) mixer circuit 200 is shown. The mixer circuit 200 may be implemented in any number of ways. For example, the mixer 200 may be implemented as an integrated circuit, such as a CMOS integrated circuit. Of course other methods of implementing the mixer 200 exist, such as using other types of semiconductor processing, or by using discrete components, for example.

The mixer 200 comprises a first mixer stage 205 and a second mixer stage 210. The first mixer stage 205 comprises a first transmission gate 215 and a second transmission gate 220. The second mixer stage comprises a third transmission gate 225 and a fourth transmission gate 230. For the mixer 200 the first transmission gate 215 is coupled with the third transmission gate 225 in a first "circuit path" and the second transmission gate 220 is coupled with the fourth transmission gate 230 in a second "circuit path." In this respect, such a configuration may address at least some of the disadvantages of the mixer 100 shown in FIG. 1 and described above. Such improvements result, at least in part, from an increase in the linear range of such a mixer circuit due to the use of the transmission gates 215–230. These improvements will be discussed further below with respect to FIGS. 3 and 4.

The mixer 200 further comprises differential mixed signal terminals 235 and 240. The mixed signal terminal 235 is coupled with the first transmission gate 215 and the third transmission gate 225. The mixed signal terminal 240 is coupled with the second transmission gate 220 and the fourth transmission gate 230.

The mixer 200 still further comprises a first LO signal terminal 245 and a second LO signal terminal 250 that are coupled with the first, second, third and fourth transmission gates 215–230. The LO signal terminals 245 and 250 are coupled with the transmission gates 215-230 such that the first transmission gate 215 and the second transmission gate 220 operate 180 degrees out of phase with, respectively, the third transmission gate 225 and the fourth transmission gate 230. The operation of such a circuit will be discussed in more detail with respect to FIG. 3.

The mixer 200 still further includes a first base band signal terminal 255 coupled with the first and second transmission gates (215 and 220) and a second base band signal terminal 260 coupled with the third and fourth transmission gates (225 and 230). The base band signal terminals 255 and 260 may be used to communicate a differential base band signal to the mixer 200 to be mixed with a LO signal and/or to communicate an extracted base band signal from the mixer 200 to other circuitry, such as an audio circuit, as was indicated earlier.

Figure 3:
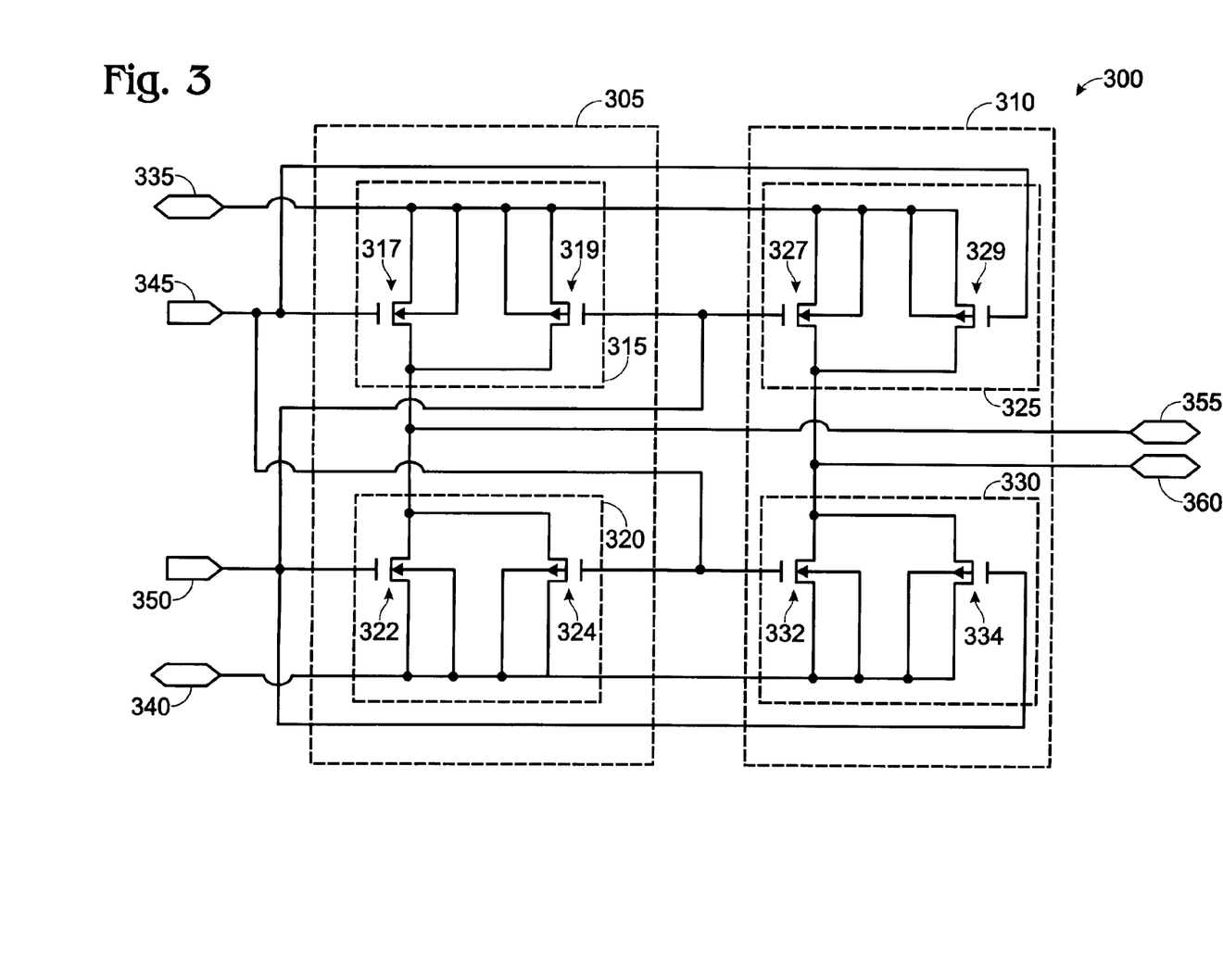
FIG. 3 is a schematic diagram illustrating another improved mixer circuit.

Referring now to FIG. 3, a more detailed schematic diagram of a t-gate mixer circuit 300 is shown. It is noted that the mixer circuit 300 contains analogous elements to the mixer circuit 200 shown in FIG. 2. Elements of the mixer 300 that are analogous to those of the mixer 200 have been referenced with corresponding 300 series reference numerals. For example, while the first stage of the mixer 200 is referenced as 205, a first stage of the mixer 300 is referenced as 305. This convention is consistent throughout FIG. 3. For the sake of brevity, these analogous elements will only be described, with respect to FIG. 3, to describe the function of the mixer 300 with respect to the additional detail of the transmission gates 315, 320, 325 and 330.

The transmission gates 315, 320, 325 and 330 of the mixer 300 comprise CMOS transmission gates, each having an n-type field-effect transistor (FET), respectively 317, 322, 327 and 332; and a p-type FET, respectively 319, 324, 329 and 334. Each n-type FET has a source terminal and a drain terminal coupled, respectively, with a source terminal and a drain terminal of its corresponding p-type FET. Further, the source terminals of the n-type FETs 317 and 327 and the p-type FETs 319 and 329 of the first transmission gate 315 and the third transmission gate 325 are coupled with the first mixed signal terminal 335. Likewise, the source terminals of the n-type FETs 322 and 332 and p-type FETs 324 and 334 of the second transmission gate 320 and the fourth transmission gate 330 are coupled with the second mixed signal terminal 340.

As is shown in FIG. 3, gate terminals of the n-type FETs 317 and 332 of, respectively, the first transmission gate 315 and the fourth transmission gate 330, and gate terminals of the p-type FETs 324 and 329 of, respectively, the second transmission gate 320 and the third transmission gate 325 are coupled with the first LO signal terminal 345. Likewise, gate terminals of the n-type FETs 322 and 327 of, respectively, the second transmission gate 320 and the third transmission gate 325, and gate terminals of the p-type FETs 319 and 334 of, respectively, the first transmission gate 315 and the fourth transmission gate 330 are coupled with the second LO signal terminal 350. Such a configuration provides for the transmission gates of each stage in a circuit path (e.g. 315 and 325) to operate substantially 180 out of phase with each other.

For the mixer 300, the first base band signal terminal 355 is coupled with the drain terminals of the n-type FETs (317 and 322) and the p-type FETs (319 and 324) of the first and second transmission gates (315 and 320). Likewise, the second base band signal terminal 360 is coupled with the drain terminals of the n-type FETs (327 and 332) and the p-type FETs (329 and 334) of the third and fourth transmission gates (325 and 330).

A mixer circuit having the configuration of mixer 300 provides certain performance advantages over prior mixer circuits, such as the mixer 100 shown in FIG. 1. For example, the use of the CMOS transmission gates results in improved linearity of the mixer 300 over such prior circuits. This improved linearity results, at least in part, from the relative resistance characteristics of the n-type FET and p-type FET of each transmission gate.

Looking specifically at a single transmission gate, the first transmission gate 315, for signals (e.g., mixed signals or base band signals) that have relatively low amplitudes, the n-type FET 317 will have a low channel resistance due to the relatively high $V_{gs}$ present when the LO signal is high. Conversely, the p-type FET 319 will have a relatively high channel resistance in this situation. As the signal amplitude (mixed signal or base band) increases, the $V_{gs}$ of the n-type FET 317 likewise decreases, causing a corresponding increase in the channel resistance of the n-type FET 317. However, in this situation, the channel resistance of the P-type FET 319 will decrease, allowing the signals being processed by the mixer 300 to be readily conducted through the transmission gate over a larger range of signal amplitudes. Therefore, the linearity of the mixer 300 is improved, which results in an increase in the 1-db compression point and the IP3 point of the mixer 300 over prior approaches.

Also, the mixer 300 may be implemented on an integrated circuit, such that the first, second, third and fourth transmission gates (315, 320, 325 and 330) are substantially physically symmetric. Further, the first and second transmission gates (315 and 320) may be implemented so as to have the same orientation with respect to each other, while the third and fourth transmission gates (325 and 330) also have the same orientation with respect to each other. Such an arrangement may provide additional advantages over other techniques, such as those using discrete components. For example, such a configuration would reduce the amount of LO signal feedthrough. Such LO signal feedthrough results, at least in part, from mismatch (e.g. differences in electrical characteristics) in the transistors used to implement such a mixer circuit. Therefore, because such transistors will be closely matched, implementing the mixer 300 in the above-described fashion will reduce such mismatches.

Figure 4:
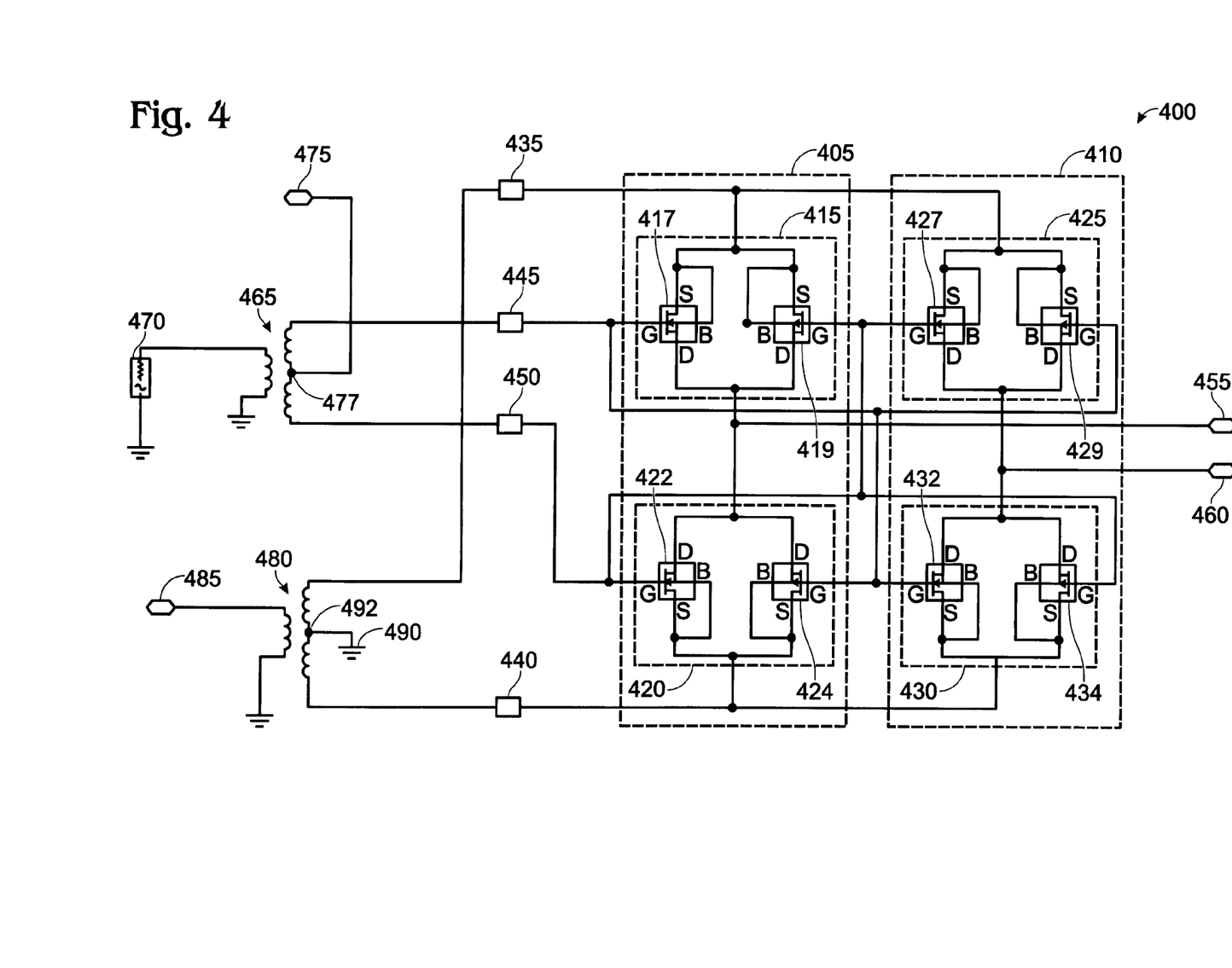
FIG. 4 is a schematic diagram of yet another improved mixer circuit.

Referring now to FIG. 4, a schematic diagram of yet another mixer circuit 400 is shown. The mixer circuit 400 may be implemented in a number of fashions. For example, the mixer 400 may be implemented as an "up-converter" used to mix a base band signal with a LO signal to generate a single-ended mixed signal. The mixer 400 may also be implemented as a "down-converter" to receive a single-ended mixed signal, convert that single-ended mixed signal to a differential mixed signal and then extract a base band signal from the differential mixed signal.

In a similar fashion as with the mixer 300, the mixer 400 shown in FIG. 4 contains analogous elements to the mixers 200 and 300 shown in, respectively, FIG. 2 and FIG. 3. These elements have reference numbers 405–460 that correspond with the reference numbers 205–260 of FIG. 2 and 305–360 of FIG. 3. Again, for the sake of brevity, these analogous elements will not be discussed in detail with respect to FIG. 4.

The mixer 400 comprises a first balanced-unbalanced device (balun) 465. The first balun 465 comprises a transformer and is coupled with a LO circuit 470, which may generate an RF signal for up-converting or down-converting mixed signals, as has been previously described. The LO signal produced by the LO circuit 470 is an RF range single-ended signal that is then communicated to the first balun 465. The first balun 465 is further coupled with a voltage reference terminal 475 via a center tap 477 in one coil of the first balun 465. By applying an appropriate voltage to the voltage reference terminal 475, the single-ended LO signal may be converted to a differential LO signal by the first balun 465. The differential LO signal may then be communicated to the mixer 400 via the LO signal terminals 445 and 450. The mixer 400 may then use the differential LO signal to up-convert or down-convert signals as has been previously described.

The mixer circuit 400 also comprises a second balun 480 that is coupled with a single-ended mixed signal terminal 485. The second balun 480 is also coupled with a ground voltage reference 490 via a center tap 492. With this configuration, the mixer 400 may receive a mixed signal (e.g. RF signal) that is single-ended (via the signal terminal 485) and convert that single-ended mixed signal to a differential mixed signal that is communicated to the mixer 400 for down-conversion. Alternatively, the mixer 400 may communicate a differential mixed signal to the second balun 480, which the balun then converts to a single-ended mixed signal that is communicated external to the mixer 400 via the signal terminal 485.

As was just described, the mixer circuits 200, 300 and 400 may be used both for up-converting and down-converting various types of signals. These mixer circuits have certain advantages over prior circuits due to the increased linearity of the mixer stages. Such circuits are also advantageous, as a single circuit design may be used for both receivers and transmitters in a single integrated circuit (single-chip) radio. Such a single-chip radio may then be used as a transceiver in, for example, handheld two-way radios, though numerous other applications for such mixer circuits exist.

Transmission Gate Mixer with Gate Bias

Figure 5:
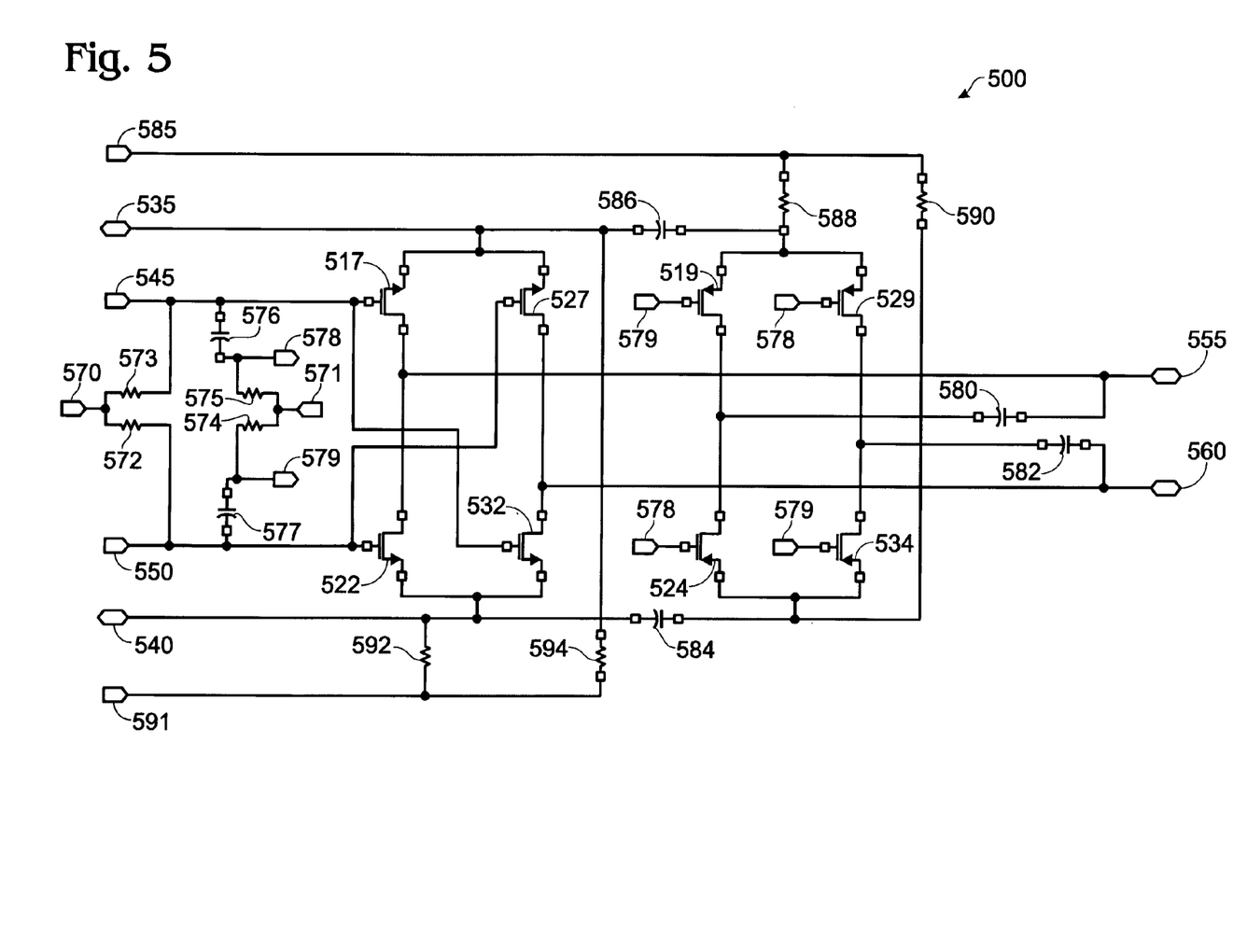
FIG. 5 is schematic diagram illustrating yet another improved mixer circuit.

Referring to FIG. 5, a schematic diagram illustrating another transmission gate mixer circuit 500 that may be used for up-converting and/or down-converting is shown. The mixer circuit 500 allows for bias voltages (e.g., a direct-current (DC) bias voltages) to be applied to the gates of the transistors of the transmission gates. These bias voltages may be a percentage of the threshold voltages of the n-type and p-type transistors of the transmission gates. Such an approach provides for the use of a lower amplitude local oscillator signal, which would result in the mixer circuit 500 consuming less power as compared to mixer circuits using a higher amplitude local oscillator signal. Furthermore, such an approach may further improve the linearity of the mixer circuit 500, as compared to the mixer circuit illustrated in FIG. 1. This improvement in linearity would result from the ability to more readily and/or quickly achieve saturation in the transistors of the transmission gates due to the presence of the DC bias voltages.

The mixer circuit 500 includes analogous elements to the mixer circuit 300 illustrated in FIG. 3. These analogous elements are referenced with 500 series reference numbers that correspond with the 300 series reference numbers in FIG. 3. Specifically, the elements with reference numbers 517–560 are analogous with elements of the mixer 300. Elements of the mixer 500 that are not analogous with the mixer 300 are referenced with reference numbers 570 through 594. For the sake of brevity and clarity, the elements of the mixer 500 that are analogous with the mixer 300 will not be described in detail again with respect to FIG. 5 except as is needed to understand the arrangement and function of the mixer 500.

Due to the particular circuit arrangement of the mixer 500, the n-type and p-type transistors for each transmission gate are not shown adjacent to one another as they were illustrated for the mixer 300 in FIG. 3. Instead, the n-type transistors 517, 522, 527 and 532 of the four transmission gates of the mixer 500 are arranged in a two-by-two array in FIG. 5. Likewise, the p-type transistors 519, 524, 529 and 534 of the four transmission gates are arranged in a separate, corresponding two-by-two array in FIG. 5. Again, the 500 series reference numbers used to designate these transistors are analogous with the 300 series reference numbers used to designate corresponding transistors of the transmission gates in FIG. 3.

In contrast to the mixer of FIG. 3, the mixer 500 illustrated in FIG. 5 includes a first bias-voltage terminal 570 and a second bias-voltage terminal 571. The bias-voltage terminal 570 is used to apply a first bias voltage to the gates of the n-type transistors 517, 522, 527 and 532 of the mixer 500. This first bias voltage may be a DC voltage that is a percentage of the nominal threshold voltage of the n-type transistors 517, 522, 527 and 532. As shown in FIG. 5, the first bias voltage is applied to the local oscillator signal terminals 545 and 550 via, respectively, a first resistor 572 and a second resistor 573. The resistors 572 and 573 prevent shorting of the local oscillator signal to a circuit (or device) that is supplying the first bias voltage. It will be appreciated that any number of techniques may be used to provide the first bias voltage, such as an external voltage reference or a bias generation circuit, for example. The first bias voltage may be a DC voltage that is a percentage of the threshold voltage (e.g., 50% or greater, though lower values may be used) of the n-type transistors.

Similarly, the second bias-voltage terminal 571 is used to apply a second bias voltage to the gates of the p-type transistors 519, 524, 529 and 534 of the mixer circuit 500. The second bias voltage may be a DC voltage that is a percentage of the nominal threshold voltage of the p-type transistors 519, 524, 529 and 534. The second bias voltage is applied to the gates of the p-type transistors 519, 524, 529 and 534 via respective resistors 574 and 575 and respective local oscillator signal terminals 578 and 579. The local oscillator signal terminals 578 and 579 (for supplying the local oscillator signal to the p-type transistors) are isolated from the local oscillator terminals 545 and 550 (for supplying the local oscillator signal to the n-type transistors) using capacitors 576 and 577, respectively. The capacitors 576 and 577 allow for applying unique bias voltages for the first bias voltage (to the n-type transistors) and the second bias voltage (to the p-type transistors), as well as allowing the local oscillator (AC signal) to be communicated to both the n-type transistors and the p-type transistors. As with the first bias voltage, it will be appreciated that any number of techniques may be used to provide the second bias voltage. The second bias voltage may be a DC voltage that is a percentage of the threshold voltage (e.g., 50% or greater, though lower values may be used) of the p-type transistors.

In addition to the first bias voltage and the second bias voltage (which are applied respectively to the gates of the n-type and p-type transistors of the mixer circuit 500), the source terminals of the p-type transistors 519, 524, 529 and 534 are coupled with a power supply terminal via resistors 588 and 590. Similarly, the source terminals of the n-type transistors 517, 522, 527 and 532 are coupled with an electrical ground terminal 591 via resistors 592 and 594. The source terminals of the p-type transistors are isolated from the source terminals of the n-type transistors using capacitors 584 and 586, which prevent shorting between the power supply terminal 585 and the electrical ground terminal 591. The application of a power supply voltage and electrical ground provides for establishing the threshold voltages of the p-type and n-type transistors.

The mixer circuit 500 further includes capacitors 580 and 582, which isolate the drain terminals of the n-type transistors 517, 522, 527 and 532 and the drain terminals of the p-type transistors 519, 524, 529 and 534 to prevent the shorting of baseband signals that are communicated to/from the differential baseband signal terminals 555 and 560.

Bias Generation Circuit

Figure 6:
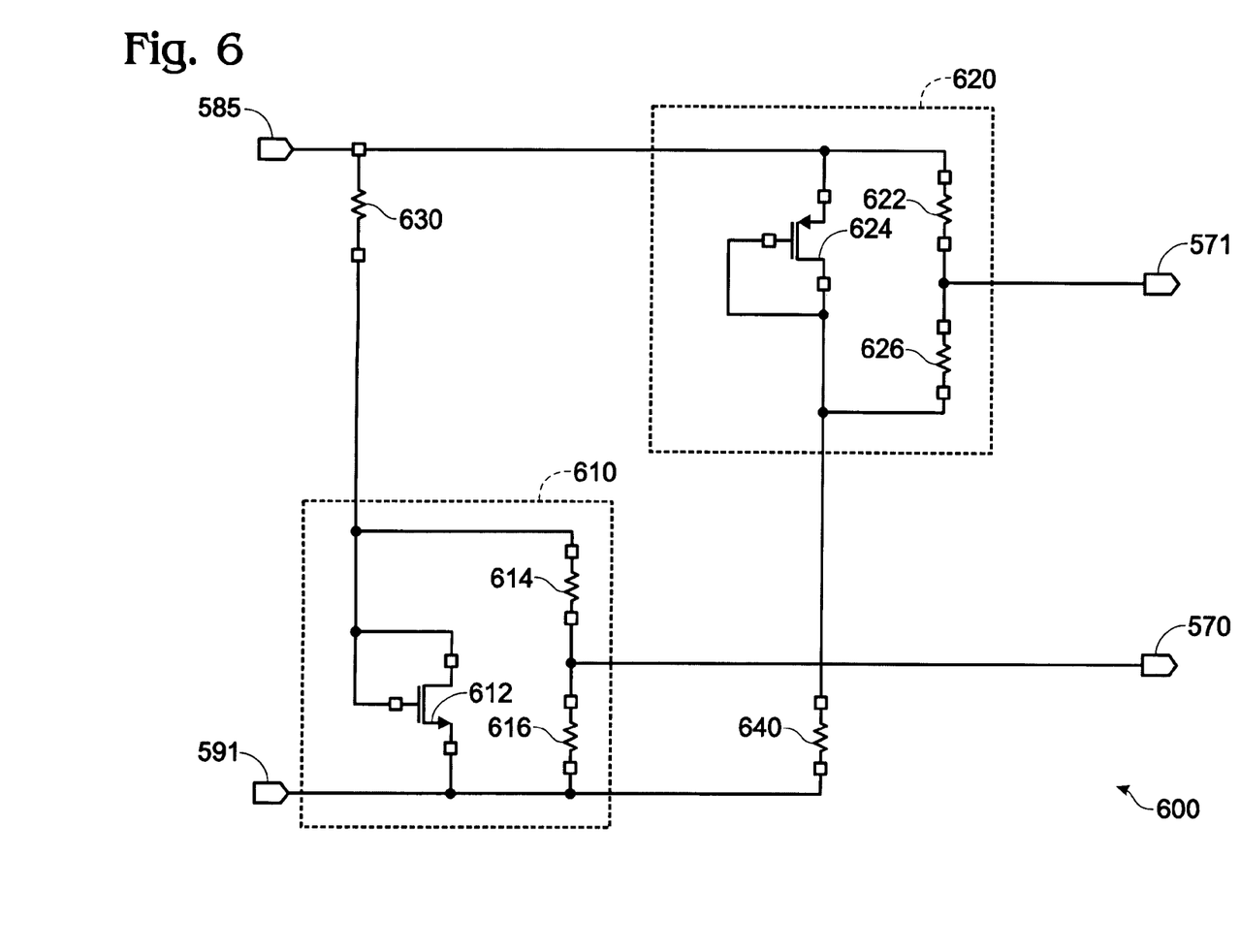
FIG. 6 is schematic diagram illustrating a bias generator circuit that may be used in conjunction with the mixer circuit illustrated in FIG. 5.

Referring to FIG. 6, a bias generation circuit 600 that may be used in conjunction with the mixer circuit 500 to generate the first and second bias voltages is shown. The bias generator 600 provides for generating the first and second bias voltages, such that the first and second bias voltages track changes in threshold voltages due to process variation (such as in an integrated circuit implementation) and environmental conditions (such as junction temperature).

The bias generation circuit 600 includes a first potentiometer 610 for generating the first bias voltage that is applied, via the bias-voltage terminal 570, to the n-type transistors 517, 522, 527 and 532. The potentiometer 610 includes an n-type transistor 612 and a resistor divider that includes resistors 614 and 616. The resistance values of the resistors 614 and 616 are selected based on the percentage of the n-type transistor threshold voltage that is desired to be applied as the first bias voltage. The use of the n-type transistor 612 in the potentiometer 610 will result in the bias voltage that is produced by the potentiometer (at a fixed power supply voltage) varying as result of process variation (e.g., changes in process that effect the threshold voltage of the transistor).

Likewise, the voltage produced by the potentiometer 610 will also vary as a result of changes in temperature, which, as is known, affects the threshold voltage of field effect transistors. Therefore, the bias generator 600 may be beneficial as it may be used to provide a bias voltage that is a substantially fixed percentage of the threshold voltage, even as that threshold voltage varies.

The bias generation circuit 600 also includes a second potentiometer 620. The potentiometer 620 includes a p-type transistor 622 and a resistor divider that includes the resistors 624 and 626. The potentiometer 620 may be used to supply the second bias voltage (via the bias-voltage terminal 571) to the gates of the p-type transistors 519, 524, 529 and 534 of the mixer circuit 500. The potentiometer 620 operates in a substantially similar fashion as the potentiometer 610 in providing the second bias voltage. As with the first bias voltage, the second bias voltage produced by the potentiometer 620 is a substantially fixed percentage of the threshold voltage of the p-type transistors 519, 524, 529 and 534. Also as with the potentiometer 610, the second bias voltage produced by the potentiometer 620 will vary with changes in the threshold voltage of the p-type transistor 622 (e.g., due to process variation or changes in temperature).

The bias generation circuit 600 further includes resistors 630 and 640. The resistors 630 and 640 operate as current sources in the bias generation circuit 600 to ensure that current is supplied to the n-type transistor 611 and the p-type transistor 622 for generation of the first and second bias voltages for the mixer 500 of FIG. 5.

CONCLUSION

While a number of aspects and embodiments have been discussed above, it will be appreciated that various modifications, permutations, additions and/or sub-combinations of these aspects and embodiments are possible. It is therefore intended that the following appended claims and claims hereafter introduced are interpreted to include all such modifications, permutations, additions and/or sub-combinations as are within their true spirit and scope.

What is claimed is:

1. A mixer circuit comprising:
a first stage including first and second transmission gates coupled with one another;
a second stage including third and fourth transmission gates coupled with one another;
first and second local oscillator signal terminals coupled with the first and second stages such that, in operation, the first and fourth transmission gates operate substantially in phase with one another and the second and third transmission gates operate substantially in phase with one another;
first and second mixed signal terminals, the first mixed signal terminal being coupled with the first and third transmission gates and the second mixed signal terminal being coupled with the second and fourth transmission gates;
first and second baseband signal terminals, the first baseband signal terminal being coupled with the first and second transmission gates and the second baseband signal terminal being coupled with the third and fourth transmission gates;
a first bias-voltage terminal coupled with a transistor gate of a n-type transistor of each of the first, second, third and fourth transmission gates, the first bias-voltage terminal, in operation, receiving a first DC bias voltage that is a fraction of a nominal threshold voltage of the n-type transistors of the first, second, third and fourth transmission gates; and
a second bias-voltage terminal coupled with a transistor gate of a p-type transistor of each of the first, second, third and fourth transmission gates, the second bias-voltage terminal, in operation, receiving a second DC bias voltage that is a fraction of a nominal threshold voltage of the p-type transistors of the first, second, third and fourth transmission gates.

2. The mixer circuit of claim 1, wherein:
the first bias-voltage terminal is coupled with the gates of the n-type transistors of the first and fourth transmission gates via a first resistor and coupled with the gates of the n-type transistors of the second and third transmission gates via a second resistor; and
the second bias-voltage terminal is coupled with the gates of the p-type transistors of the second and third transmission gates via a third resistor and coupled with the gates of the p-type transistors of the first and fourth transmission gates via a fourth resistor.

3. The mixer circuit of claim 2, further comprising:
a bias generator, the bias generator being coupled with the first and second bias voltage terminals, wherein the bias generator includes:
a first potentiometer coupled with the first bias-voltage terminal, the first potentiometer, in operation, producing the first DC bias voltage; and
a second potentiometer coupled with the second bias-voltage terminal, the second potentiometer, in operation, producing the second DC bias voltage.

4. The mixer circuit of claim 3, wherein the first potentiometer comprises a n-type transistor in parallel with a resistor divider such that, in operation, the first DC bias voltage varies with temperature.

5. The mixer circuit of claim 3, wherein the second potentiometer comprises a p-type transistor in parallel with a resistor divider such that, in operation, the second DC bias voltage varies with temperature.

6. The mixer circuit of claim 1, wherein source terminals of the n-type transistors of the first, second, third and fourth transmission gates are coupled with an electrical ground via a resistor.

7. The mixer circuit of claim 1, wherein source terminals of the p-type transistors of the first, second, third and fourth transmission gates are coupled with a power supply voltage via a resistor.

8. The mixer circuit of claim 1, further comprising:
a first capacitor coupled with the first baseband signal terminal and drain terminals of p-type transistors of the first and second transmission gates, wherein the first baseband signal terminal is coupled directly with drain terminals of n-type transistors of the first and second transmission gates; and
a second capacitor coupled with the second baseband signal terminal and drain terminals of p-type transistors of the third and fourth transmission gates, wherein the second baseband signal terminal is coupled directly with drain terminals of n-type transistors of the third and fourth transmission gates.

9. The mixer circuit of claim 1, wherein:
source terminals of the p-type transistors of the first and third transmission gates are electrically isolated from source terminals of the n-type transistors of the first and third transmission gates by a first capacitor; and
source terminals of the p-type transistors of the second and fourth transmission gates are electrically isolated from source terminals of the n-type transistors of the second and fourth transmission gates by a second capacitor.

10. The mixer circuit of claim 1, further comprising:
a first capacitor coupled with the first local oscillator signal terminal, the first capacitor isolating gates of n-type transistors of the first and fourth transmission gates from gate of p-type transistors of the second and third transmission gates; and
a second capacitor coupled with the second local oscillator signal terminal, the second capacitor isolating gates of n-type transistors of the second and third transmission gates from gates of p-type transistors of the first and fourth transmission gates.

11. The mixer circuit of claim 1, wherein the first DC bias voltage is at least 50% of the nominal threshold of the n-type transistors.

12. The mixer circuit of claim 1, wherein the second DC bias voltage is at least 50% of the nominal threshold of the p-type transistors.

13. A mixer circuit comprising:
a first stage including first and second transmission gates coupled with one another, the first and second transmission gates each including complimentary transistors; and
a second stage including third and fourth transmission gates coupled with one another, the third and fourth transmission gates each including complimentary transistors,
wherein, in response to a differential local oscillator signal, the first and fourth transmission gates operate substantially in-phase with each other and the second and third transmission gates operate substantially in-phase with each other to effect one of:
up-converting a first differential baseband signal to a first differential mixed signal by mixing the first differential baseband signal with the differential local oscillator signal; and
down-converting a second differential mixed signal by extracting a second differential baseband signal using the differential local oscillator signal.

14. The mixer circuit of claim 13, wherein the first and second differential signals are radio frequency signals.

15. The mixer circuit of claim 13, further comprising:
first and second local oscillator signal terminals coupled with the first and second stages for receiving the differential local oscillator signal;
first and second mixed signal terminals, the first mixed signal terminal being coupled with the first and third transmission gates and the second mixed signal terminal being coupled with the second and fourth transmission gates, the first and second mixed differential signals, in operation, being communicated via the first and second mixed signal terminals;
first and second baseband signal terminals, the first baseband signal terminal being coupled with the first and second transmission gates and the second baseband signal terminal being coupled with the third and fourth transmission gates the first and second differential baseband signals, in operation, being communicated via the first and second baseband signal terminals.

16. The mixer circuit of claim 13, further comprising:
a first bias-voltage terminal coupled with a transistor gate of a n-type transistor of each of the first, second, third and fourth transmission gates, the first bias-voltage terminal, in operation, receiving a first DC bias voltage that is a fraction of a nominal threshold voltage of the n-type transistors of the first, second, third and fourth transmission gates; and
a second bias-voltage terminal coupled with a transistor gate of a p-type transistor of each of the first, second, third and fourth transmission gates, the second bias-voltage terminal, in operation, receiving a second DC bias voltage that is a fraction of a nominal threshold voltage of the p-type transistors of the first, second, third and fourth transmission gates.

17. The mixer circuit of claim 16, wherein:
the first bias-voltage terminal is coupled with the gates of the n-type transistors of the first and fourth transmission gates via a first resistor and coupled with the gates of the n-type transistors of the second and third transmission gates via a second resistor;
the second bias-voltage terminal is coupled with the gates of the p-type transistors of the second and third transmission gates via a third resistor and coupled with the gates of the p-type transistors of the first and fourth transmission gates via a fourth resistor,
the gates of the n-type transistors of the first and fourth transmission gates are isolated from the gates of the p-type transistors of the second and third transmission gates with a first capacitor; and
the gates of the n-type transistors of the second and third transmission gates are isolated from the gates of the p-type transistors of the first and fourth transmission gates with a second capacitor.

18. The mixer circuit of claim 16, further comprising:
a bias generator, the bias generator being coupled with the first and second bias voltage terminals, wherein the bias generator includes:
a first potentiometer coupled with the first bias-voltage terminal, the first potentiometer, in operation, producing the first DC bias voltage; and
a second potentiometer coupled with the second bias-voltage terminal, the second potentiometer, in operation, producing the second DC bias voltage.

19. A mixer circuit comprising:
a first stage including first and second transmission gates coupled with one another;
a second stage including third and fourth transmission gates coupled with one another;
a first bias-voltage terminal coupled with a transistor gate of a n-type transistor of each of the first, second, third and fourth transmission gates, the first bias-voltage terminal, in operation, receiving a first DC bias voltage that is a fraction of a nominal threshold voltage of the n-type transistors of the first, second, third and fourth transmission gates;
a second bias-voltage terminal coupled with a transistor gate of a p-type transistor of each of the first, second, third and fourth transmission gates, the second bias-voltage terminal, in operation, receiving a second DC bias voltage that is a fraction of a nominal threshold voltage of the p-type transistors of the first, second, third and fourth transmission gates; and a bias generator, the bias generator being coupled with the first and second bias voltage terminals, wherein the bias generator includes:
  a first potentiometer coupled with the first bias-voltage terminal, the first potentiometer, in operation, producing the first DC bias voltage; and
  a second potentiometer coupled with the second bias-voltage terminal, the second potentiometer, in operation, producing the second DC bias voltage,
wherein, in response to a differential local oscillator signal, the first and fourth transmission gates operate substantially in-phase with each other and the second and third transmission gates operate substantially in-phase with each other to effect one of:

up-converting a first differential baseband signal to a first differential mixed signal by mixing the first differential baseband signal with the differential local oscillator signal; and down-converting a second differential mixed signal by extracting a second differential baseband signal using the differential local oscillator signal.

* * * * *